United States Patent
Pan et al.

(10) Patent No.: US 11,460,518 B2
(45) Date of Patent: Oct. 4, 2022

(54) METHOD FOR ANALYZING MAGNETIC DETECTION BLIND ZONE

(71) Applicants: Donghua Pan, Harbin (CN); Shengxin Lin, Harbin (CN); Yinxi Jin, Harbin (CN); Liyi Li, Harbin (CN)

(72) Inventors: Donghua Pan, Harbin (CN); Shengxin Lin, Harbin (CN); Yinxi Jin, Harbin (CN); Liyi Li, Harbin (CN)

(73) Assignee: Harbin Institute of Technology, Heilongjiang (CN)

( * ) Notice: Subject to any disclaimer, the term of this patent is extended or adjusted under 35 U.S.C. 154(b) by 237 days.

(21) Appl. No.: 16/848,787

(22) Filed: Apr. 14, 2020

(65) Prior Publication Data

US 2020/0326388 A1    Oct. 15, 2020

(30) Foreign Application Priority Data

Apr. 15, 2019    (CN) .......................... 201910300874.1

(51) Int. Cl.
*G01R 33/022*    (2006.01)
*G01R 33/00*    (2006.01)

(52) U.S. Cl.
CPC ....... *G01R 33/022* (2013.01); *G01R 33/0029* (2013.01)

(58) Field of Classification Search
CPC ... G01V 3/081; G01R 33/022; G01R 33/0029
See application file for complete search history.

(56) References Cited

U.S. PATENT DOCUMENTS

| | | | | |
|---|---|---|---|---|
| 5,777,477 A * | 7/1998 | Wynn | ..................... | G01V 3/165 |
| | | | | 324/345 |
| 7,342,399 B1 * | 3/2008 | Wiegert | ............... | G01R 33/022 |
| | | | | 324/345 |
| 2018/0292468 A1 * | 10/2018 | Guo | ................... | G01R 33/0029 |

* cited by examiner

*Primary Examiner* — Lee E Rodak
*Assistant Examiner* — Brent J Andrews
(74) *Attorney, Agent, or Firm* — Lili Chen

(57) ABSTRACT

Disclosed is a method for analyzing a blind zone of a magnetic detection method that can provide a complete distribution map of the detection blind zone within the entire zone of the magnetic target. The method comprises the first step of establishing a complete magnetic detection model to obtain calculated position and magnetic moment of a magnetic target that is detected by a magnetic gradiometer. The second step involves establishing a direction-attitude-sphere model to represent the entire zone of the magnetic target. The third step involves expanding the direction-attitude-sphere to a planar map layered by latitude and calculating success detection rates within the planar expansion map. Finally, the distribution map of the magnetic detection blind zone in the entire zone is visually presented in the planar expansion map and a complete distribution rule of the entire detection blind zone is thus obtained. This blind zone analysis method is applicable to any magnetic detection method and can provide a visual presentation of the entire detection blind zone. The knowledge of the detection blind zone can be applied to guide practical magnetic detection to avoid the detection blind zone so as to increase the detection accuracy.

2 Claims, 13 Drawing Sheets

| D(m)\φ | 0° | 15° | 30° | 45° | 60° | 75° | 90° |
|---|---|---|---|---|---|---|---|
| 0.12 | 0.97 | 0.98 | 1.10 | 1.32 | 1.83 | 3.09 | 20.69 |
| 0.18 | 1.02 | 1.04 | 1.15 | 1.36 | 1.86 | 3.21 | 16.66 |
| 0.24 | 1.02 | 1.05 | 1.16 | 1.43 | 1.89 | 3.23 | 18.53 |
| 0.30 | 1.09 | 1.11 | 1.22 | 1.47 | 2.01 | 3.47 | 21.02 |
| 0.36 | 1.14 | 1.18 | 1.30 | 1.56 | 2.11 | 3.62 | 18.39 |
| 0.42 | 1.21 | 1.24 | 1.39 | 1.69 | 2.28 | 4.02 | 20.24 |

Fig. 12

METHOD FOR ANALYZING MAGNETIC DETECTION BLIND ZONE

CROSS-REFERENCE TO RELATED APPLICATIONS

This application claims the benefit of Chinese patent application No. 201910300874.1, filed Apr. 15, 2019, the content of which is incorporated by reference herein.

FIELD OF THE INVENTION

The present invention relates to a method for analyzing a blind zone of a magnetic detection method, which belongs to the technical field of magnetic detection.

BACKGROUND OF THE INVENTION

In recent years, more and more people have paid attention to and studied magnetic detection that has been widely used in many fields. In the medical research field, it may be used for capsule endoscope positioning, tumor localization, surgical robot navigation, MEG research, etc. In the geophysics field, it may be used for cave mapping, oil-gas and mineral exploration, archaeological exploration, geomagnetic field monitoring, etc. In the military engineering field, it may be used for unexploded explosive detection, etc. The magnetic detection method is the core of a magnetic detection system. Many parts of the magnetic detection system are designed and developed around the magnetic detection method.

The magnetic detection method may be divided into an analytical inversion method and a numerical inversion method. In the numerical inversion method, a Levenberg-Marquardt (L-M) algorithm, a particle swarm optimization (PSO) algorithm and a genetic algorithm (GA) are widely used. The numerical inversion method takes more than a few seconds to complete a detection, often requires multi-point measurement, and applies to limited occasions. The analytical inversion method may determine the position and the magnetic moment of the magnetic target through single-point measurement, can track a magnetic target in real time and is widely used. The detection method mentioned herein mainly refers to the analytical inversion method. In the analytical inversion method, the NARA method and the STAR method are the main focuses.

In actual magnetic detection, the attitude of the magnetic target and the direction to the magnetic gradiometer (the direction of the magnetic target) are arbitrary. The change of the attitude and direction of the magnetic target will affect the detection error. The combination of all the possible attitudes and directions of the magnetic target are called the entire zone. Within the entire zone, the zone formed by the first bz (0≤bz≤100%) with the largest detection error is called the blind zone, where bz is called the blind zone rate. Because the blind zone is the zone with the largest detection error in the entire zone when the magnetic target is tracked, the blind zone can be avoided by analyzing the distribution rule of the blind zone, and the tracking accuracy can be improved. Meanwhile, analyzing the distribution rule of the blind zone is conducive to the improvement and compensation of the blind zone, thereby improving the detection accuracy of the detection method or proposing a new detection method. There are many problems in the existing analysis methods of the blind zone.

1. The existing analysis methods are utilized to analyze the distribution rule of the blind zone through theoretical derivation, which is only applicable to the magnetic detection method with a simple detection formula, and the calculation efficiency is low. Researchers have analyzed the distribution of the blind zone through theoretical derivation. Although these analysis methods can provide correct analyses for some magnetic detection methods, these methods are tedious in the analysis process and low in calculation efficiency. They are only applicable to the magnetic detection method with a simple detection formula. For the magnetic detection method with a complicated detection formula, it is difficult to deduce the theory, which makes it difficult to analyze the blind zone.

2. The existing analysis methods can only analyze the partial distribution rule of the blind zone, and cannot obtain the distribution rule of the blind zone in the entire zone. The existing analysis approaches of the blind zone for the detection method is to analyze the cause of generation of the blind zone by observing the detection formula, and then use theoretical derivation or simulation to confirm. However, such an approach can only obtain a partial distribution rule of the blind zone of the magnetic detection method instead of a complete distribution rule of the blind zone in the entire zone. Such an analysis is incomplete.

3. The blind zone of most magnetic detection methods has not been analyzed.

For simple magnetic detection methods, the reasons that affect the detection error and the distribution rule of the blind zone are generally relatively simple, and conclusions have been reached for these simple detection methods. However, the detection accuracy of simple magnetic detection methods is generally not high enough, and its detection formula needs to be improved. For more advanced magnetic detection methods, the reasons affecting the distribution rules of the blind zones are very complicated, and almost no one calculates the distribution rules of the blind zones for these complicated magnetic detection methods. Therefore, although blind zones of the simple magnetic detection methods have been studied, few people have studied blind zones of complex magnetic detection methods because the factors involved in creating blind zones of complex magnetic detection methods are complicated and difficult to be analyzed.

SUMMARY OF THE INVENTION

An objective of the present invention is to solve the aforementioned problems in the prior art, and provide a method for analyzing the distribution of a magnetic detection blind zone, which not only can analyze blind zones of magnetic detection methods including simple and complex detection methods, but also can efficiently provide visual distribution of the detection blind zone. The distribution of the magnetic detection blind zone is analyzed in the entire magnetic detection field (the entire zone), thereby obtaining a complete distribution map of the magnetic detection blind zone.

The present invention provides a method for analyzing a blind zone of a magnetic detection method, comprising the following steps:

a, establishing a complete magnetic detection model to calculate detected position and magnetic moment of a magnetic target: establishing a magnetic target model based on magnetic dipole model to obtain a magnetic field $\vec{B}_o$ generated only by the magnetic target; superposing a noise signal generated by the noise model $No(\mu, \sigma^2)$ onto the magnetic field $\vec{B}_o$ to obtain a superposed magnetic field $\vec{B}_r$;

establishing a magnetic sensor model based on the sensitivity of the magnetic sensor and using the magnetic sensor model to perform data processing on the magnetic field $\vec{B}_r$ to obtain a magnetic sensor $\vec{B}_s$; establishing a tensor model based on the structure of the magnetic gradiometer that is used for the magnetic detection and using the magnetic sensor $\vec{B}_s$ as an input for the tensor model data processing to obtain a gradient tensor $\vec{G}$; establishing an inversion model based on the magnetic detection method and using the gradient tensor $\vec{G}$ as an input for the inversion model data processing to obtain calculated position and magnetic moment of the magnetic target;

b, establishing a direction-attitude-sphere model of the magnetic target to represent the entire zone of all possible positions and attitudes of the magnetic target, wherein the attitude of the magnetic target is represented by its unit magnetic moment vector $\vec{m}_0$, the direction of the magnetic target is represented by its unit position vector $\vec{r}_0$, and an included angle between $\vec{m}_0$ and $\vec{r}_0$ is $\phi$, wherein a direction-sphere is formed by making $\vec{r}_0$ cover the entire direction-sphere, wherein for each $\vec{r}_0$, there is an attitude-sphere formed by making $\vec{m}_0$ cover the entire attitude-sphere, and wherein the coordinate system of the direction-sphere coincides with the coordinate system of the magnetic gradiometer, and the axis z' of the coordinate system of the attitude-sphere and $\vec{r}_0$ are aligned on the same straight line;

c, dividing the surface of the direction-attitude-sphere into meshes of an equal size so that each detection condition is represented with equal probability, and expanding the meshes into a plane layered according to their latitude, wherein N is the number of meshing layers, i and j are the number of meshing row and meshing column, respectively, wherein the latitude (La(i,j)) and the longitude (Lo(i,j)) of a mesh with the mesh row number of i and the mesh column number of j are given by the following formula:

$$\begin{cases} La(i, j) = i/N \cdot 90° \\ Lo(i, j) = \begin{cases} 180° & |i| = N(i = -N, L\ 0, L\ N, \\ & j = 0, 1, L\ 4(N-i)-1, N \geq 1) \\ j/(N-|i|) \cdot 90° & |i| \neq N \end{cases} \end{cases}$$

d, calculating detection success rates based on the magnetic detection model, the direction-attitude-sphere model and the meshing method for different meshing layer Ns and selecting the smallest meshing layer N when the detection success rates tend to be stable; and e, building a distribution map of the magnetic detection blind zone based on the magnetic detection model, the direction-attitude-sphere model and a selected meshing layer N, and analyzing the distribution map of the magnetic detection blind zone to obtain a distribution rule of the magnetic detection blind zone.

The benefits of the invented method are as follows.

(1) The influences of the direction $\vec{r}_0$ of the magnetic target and the included angle $\phi$ on the distribution of the blind zone are separately analyzed. The analysis method of the blind zone proposed herein no longer requires tedious theoretical derivation like traditional analysis methods of the blind zone, but visually displays the distribution map of the blind zone of the detection method, which greatly improves the efficiency and feasibility of the analysis.

(2) The present method of analyzing the blind zone has no limitation on the complexity of a detection method, and is universally suitable for analyzing the distribution rule of a blind zone of any magnetic detection method.

(3) A direction-attitude-sphere model of the magnetic target is established to cover the entire zone of the direction and the attitude of the magnetic target so that the present invention can analyze the distribution rule of the detection blind zone in the entire zone, thereby obtaining a complete distribution rule of the detection blind zone.

BRIEF DESCRIPTION OF THE DRAWINGS

FIG. 5-1 is a diagram of a spherical mesh when the meshing layer N=5.

FIG. 5-2 is a diagram of a spherical meshing when the meshing layer N=10.

FIG. 12 is a data chart of the detection error in the blind zone experiment.

DETAILED DESCRIPTION OF THE INVENTION

The invented method will be further described in detail below with regard to the drawings. The specific embodiments are presented here for illustrative purposes, and are not meant to limit the scope of the invention which is defined in the claims as presented.

This example relates to a method for analyzing blind zone of a magnetic detection method.

Figure 1:
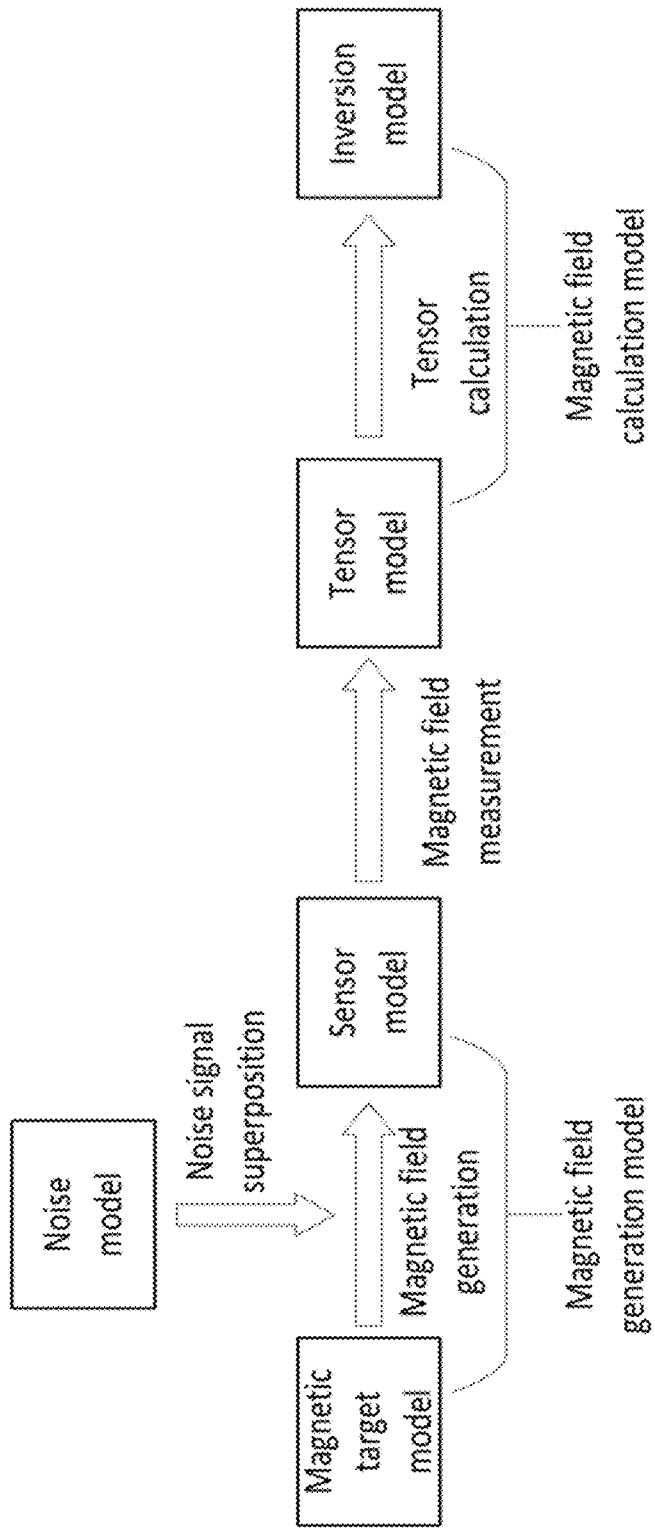
FIG. 1 is a schematic diagram of the workflow of an embodiment of a magnetic detection model.

Firstly, a complete magnetic detection model is established. A magnetic detection model may be divided into a magnetic field generation model and a magnetic field calculation model. As shown in FIG. 1, the magnetic field generation model includes a magnetic target model, a noise model, and a sensor model. The magnetic field calculation model includes a tensor model and an inversion model. Firstly, a magnetic target model, such as a magnetic dipole model, is established from a magnetic field expression of the magnetic target at any point in space, and the magnetic field $\vec{B}_O$ generated only by the magnetic target is obtained. Next, a suitable noise model, such as a Gaussian white noise model, is established, and a noise signal generated by the noise model is superposed on the magnetic field $\vec{B}_O$ to obtain the superposed magnetic field $\vec{B}_r$ at a measurement point. Then, in consideration of factors such as the resolution and offset of the magnetic sensor, a sensor model is established to perform data processing on the magnetic field $\vec{B}_r$ to obtain an output value of the magnetic sensor, $\vec{B}_s$. Thereafter, a tensor model is established based on the structure of the magnetic gradiometer, and the tension model is used to calculate an output value of the magnetic gradiometer ($\vec{G}$) using $\vec{B}_s$ as the input. Finally, an inversion model is established based on the detection formula of the magnetic detection method. $\vec{G}$ is used as an input for the inversion model data processing to obtain calculated position and magnetic moment of the magnetic target.

Next, the establishment of the magnetic field generation model is explained in detail.

(1) Magnetic Target Model

When a detection distance is 3 times more than the size of the magnetic target, the magnetic target may be regarded as a magnetic dipole. Because the detection distance is generally much larger than the size of the magnetic target itself, the magnetic target may be regarded as a magnetic dipole. The expression of magnetic induction intensity $\vec{B}_O$ generated by the magnetic dipole at any point in space is:

$$\vec{B_O} = \frac{3\mu_0(M \cdot \vec{m_0} \cdot \vec{r_0})\vec{r_0} - \mu_0 M \cdot \vec{m_0}}{4\pi r^3} = \frac{\mu_0}{4\pi} \cdot \frac{M}{r^3}(3(\vec{m_0} \cdot \vec{r_0})\vec{r_0} - \vec{m_0}) \quad (1)$$

where vacuum permeability $\mu_0 = 4\pi \times 10^{-7}$ T·m/A, M is the magnitude of the magnetic moment of the magnetic target, r is the distance between the magnetic target and the sensor, $\vec{m}_0$ and $\vec{r}_0$ are the unit magnetic moment vector and the unit position vector, respectively.

(2) Noise Model

Magnetic field noise is the interfering magnetic field signal superposed on the source magnetic field and is divided into a DC magnetic field noise and an AC magnetic field noise. Outside the magnetically shielded room, the DC magnetic field noise is dominated by the geomagnetic field. The geomagnetic field is omnipresent on the earth, and it is difficult to strip the geomagnetic field directly from the measured magnetic field. Researchers have used some methods of geomagnetic field compensation, which may control the geomagnetic field compensation error to about 30 nT. Scholars mainly use a Gaussian white noise with a mean of zero and a standard deviation of 0.5 nT to 3 nT as a model of the AC magnetic field noise. Inside the magnetically shielded room, the DC magnetic field noise does not exceed 0.6 nT, and the peak-to-peak value of the AC magnetic field noise does not exceed 4 pT. According to the 3σ principle of Gaussian distribution, the standard deviation of the AC magnetic field noise inside the magnetically shielded room does not exceed ⅔ pT.

(3) Sensor Model

The magnetic sensor plays the role of measuring the magnetic field of the magnetic target in the detection. Whether the magnetic sensor can obtain an accurate magnetic field greatly affects the detection error. The factors that affect the accuracy of the magnetic field measurement of the magnetic sensor are mainly sensitivity, production errors, and installation errors. The production errors of the sensor mainly refer to the offset, scale factor, and nonorthogonality. The installation errors mainly refer to the misalignment error between sensors when the sensors are assembled into a magnetic gradiometer. This method mainly considers the influence of the sensitivity of the magnetic sensor. The sensitivity of the magnetic sensor is crucial for the sensor to obtain high-fidelity output, and determines, to a large extent, the price of the sensor. Sensors currently used for magnetic target detection include proton magnetometers, optical pump magnetometers, superconducting quantum interferometers, fluxgate magnetometers, and anisotropic magnetoresistive magnetometers. Their resolution may reach $10^{-15}$ to $10^{-10}$ T.

The establishment of the magnetic field calculation model is explained in detail below.

(1) Tensor Model

The magnetic gradient tensor $\vec{G}$ is the gradient of three components of the magnetic field along three axes of a coordinate. The expression is:

$$\vec{G} = \nabla \vec{B} = \begin{bmatrix} \partial B_x/\partial x & \partial B_x/\partial y & \partial B_x/\partial z \\ \partial B_y/\partial x & \partial B_y/\partial y & \partial B_y/\partial z \\ \partial B_z/\partial x & \partial B_z/\partial y & \partial B_z/\partial z \end{bmatrix} = \begin{bmatrix} G_{xx} & G_{xy} & G_{xy} \\ G_{yx} & G_{yy} & G_{yz} \\ G_{zx} & G_{zy} & G_{zz} \end{bmatrix} \quad (2)$$

In an observation area without space current density, divergence and rotation of the magnetic field are both 0, so the magnetic gradient tensor $\vec{G}$ has symmetry, that is, $$\begin{cases} B_{xy} = B_{yx} \\ B_{xz} = B_{zx} \\ B_{yz} = B_{zy} \\ B_{xx} + B_{yy} + B_{zz} = 0 \end{cases} \quad (3)$$

According to formula (3), 5 of 9 elements of the magnetic gradient tensor are independent, and only 5 elements need to be measured to obtain the magnetic gradient tensor. In magnetic detection, the magnetic gradient tensor is generally calculated by a magnetic gradiometer composed of a magnetic sensor array. On an axis, a distance between the two sensors is called the baseline distance that is represented by D. A calculation expression of the elements in the magnetic gradient tensor is:

$$G_{ij} = \frac{B_i^{j+} - B_i^{j-}}{D} \quad (4)$$

where i=x, y, z, j=x, y, z, and $B_i^{j+}$ represents a component i of the output of the magnetic sensor in the positive direction of an axis j.

(2) Inversion Model

Figure 2:
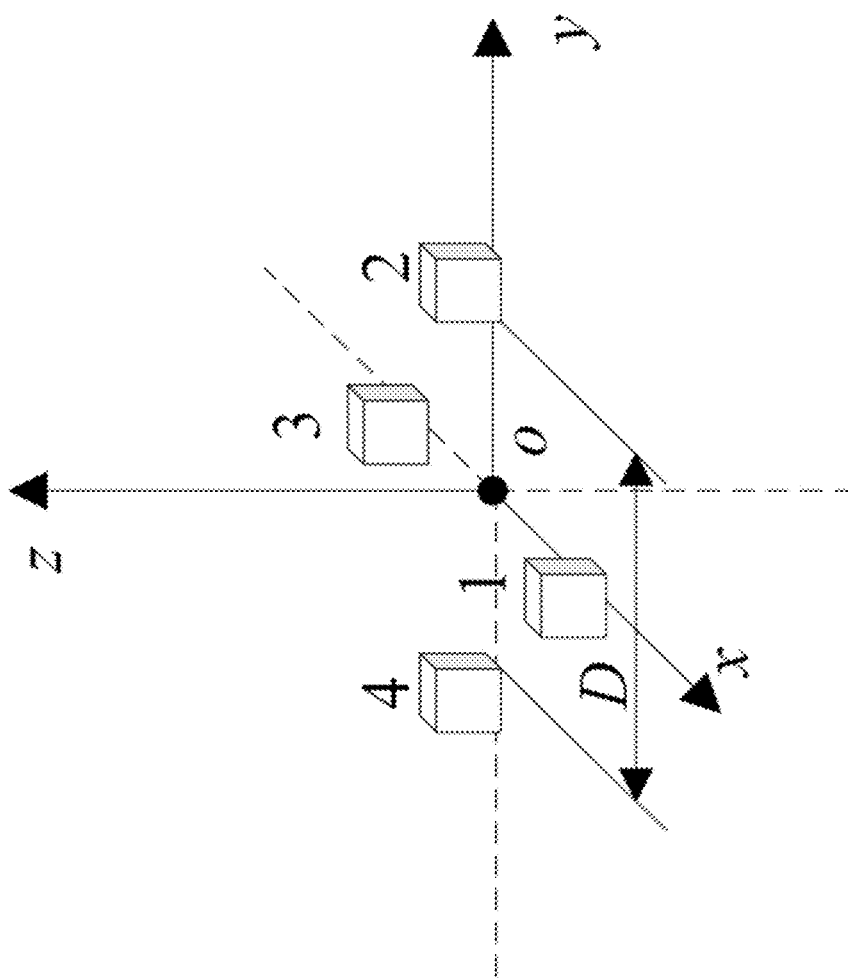
FIG. 2 is a schematic diagram of a magnetic gradiometer with a cross-shaped structure.

In 2006, T. Nara et al. proposed the NARA method with high detection speed and high accuracy, which has attracted widespread attention. The NARA method is used as an example to establish the inversion model. The establishment process of the inversion models by other magnetic detection methods is completely similar. The structure of the magnetic gradiometer in the NARA method is cross-shaped, as shown in FIG. 2. A center of the cross-shaped structure is used as an origin to establish a spatial rectangular coordinate system, and directions of three axes of the sensor are the same as those of the coordinate system.

Formulas (3) and (4) may be used to obtain a calculation expression of the magnetic gradient tensor $\vec{G}$ of the magnetic gradiometer with the cross-shaped structure:

$$\vec{G} = \frac{1}{D}\begin{bmatrix} B_{1x}-B_{3x} & B_{1y}-B_{3y} & B_{1z}-B_{3z} \\ B_{1y}-B_{3y} & B_{2y}-B_{4y} & B_{2z}-B_{4z} \\ B_{1z}-B_{3z} & B_{2z}-B_{4z} & B_{3x}+B_{4y}-B_{1x}-B_{2y} \end{bmatrix} \quad (5)$$

where $B_{1x}$ represents component x of the output of the magnetic sensor labeled 1. According to Euler's equation and the magnetic dipole model, the position vector $\vec{r}$ of the magnetic target may be calculated as:

$$\vec{r} = \begin{bmatrix} x \\ y \\ z \end{bmatrix} = -3G^{-1}\vec{B} = -3G^{-1}\begin{bmatrix} \left(\sum_{k=1}^{4}B_{x,k}\right)/4 \\ \left(\sum_{k=1}^{4}B_{y,k}\right)/4 \\ \left(\sum_{k=1}^{4}B_{z,k}\right)/4 \end{bmatrix} \quad (6)$$

where $B_{x,k}$, $B_{y,k}$ and $B_{z,k}$ are three-axis components of the output of magnetic sensor labeled k. After calculating position coordinates of the magnetic target, the magnetic moment of the magnetic target may be calculated according to formula (1):

$$\vec{m} = \begin{bmatrix} m_x \\ m_y \\ m_z \end{bmatrix} = \frac{2\pi r}{\mu_0}\begin{bmatrix} 3x^2-2r^2 & 3xy & 3xz \\ 3xy & 3y^2-2r^2 & 3yz \\ 3xz & 3yz & 3z^2-2r^2 \end{bmatrix}\begin{bmatrix} \left(\sum_{k=1}^{8}B_{x,k}\right)/8 \\ \left(\sum_{k=1}^{8}B_{y,k}\right)/8 \\ \left(\sum_{k=1}^{8}B_{z,k}\right)/8 \end{bmatrix} \quad (7)$$

wherein x, y, and z are the calculated position coordinates of the magnetic target.

Figure 3:
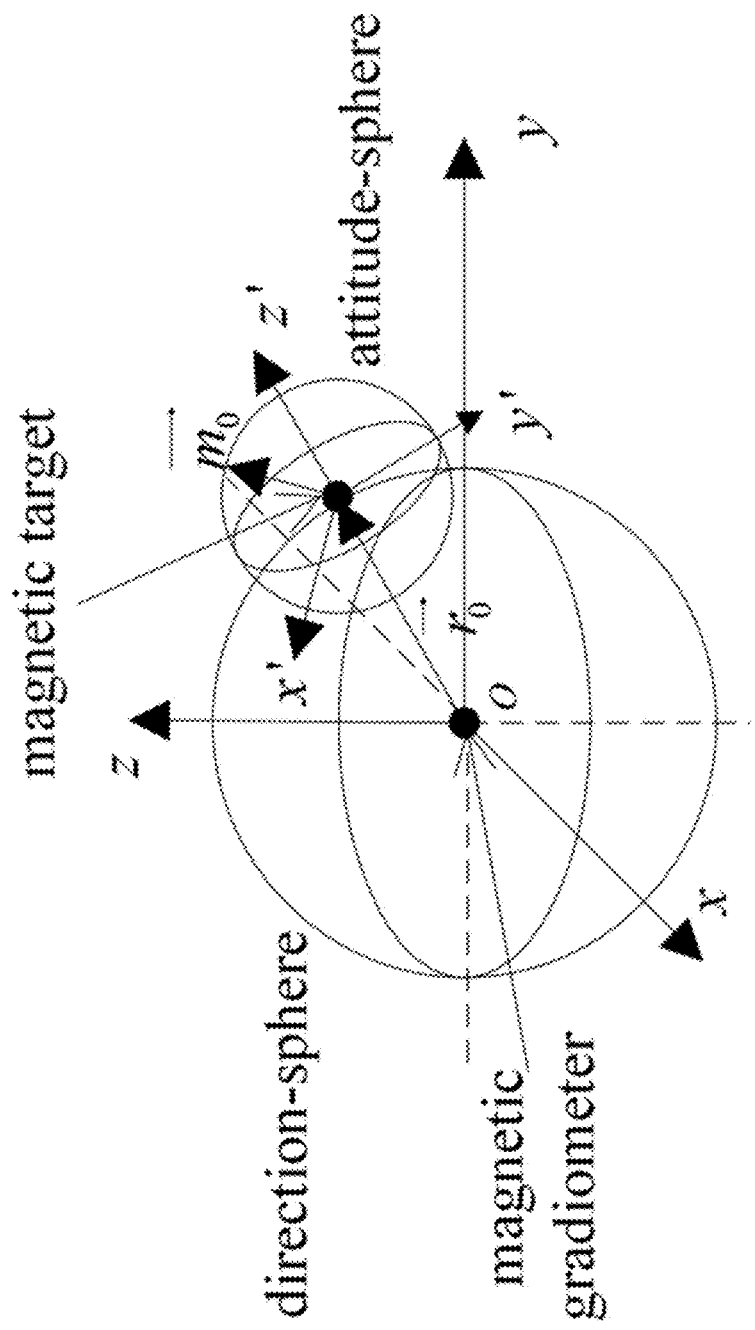
FIG. 3 is a schematic diagram of a direction-attitude-sphere model.

To obtain a complete distribution rule of the blind zone, it is necessary to analyze the distribution of the blind zone in the entire zone. Therefore, a direction-attitude-sphere analysis model is established to cover the entire zone of the position and the attitude of the magnetic target, as shown in FIG. 3.

The attitude of the magnetic target is represented by the unit magnetic moment vector $\vec{m}_0$. The direction of the magnetic target to the magnetic gradiometer (the direction of the magnetic target) is represented by the unit position vector $\vec{r}_0$. An included angle between $\vec{m}_0$ and $\vec{r}_0$ is φ. The direction-sphere is formed by making $\vec{r}_0$ cover the entire sphere. For each $\vec{r}_0$, there is an attitude-sphere formed by making $\vec{m}_0$ cover the entire sphere. The coordinate system of the direction-sphere coincides with the coordinate system of the magnetic gradiometer. The axis z' of the coordinate system of the attitude-sphere and $\vec{r}_0$ are consistently on the same straight line. Through the direction-attitude sphere analysis model, the influence of all combinations of values of $\vec{m}_0$ and $\vec{r}_0$ on the detection error is taken into consideration, that is, the influence of all combinations of attitudes and directions of the magnetic target on the detection error is taken into consideration. Therefore, based on the directional-attitude sphere analysis model, it is possible to calculate the distribution of the blind zone in the entire zone.

Figure 4:
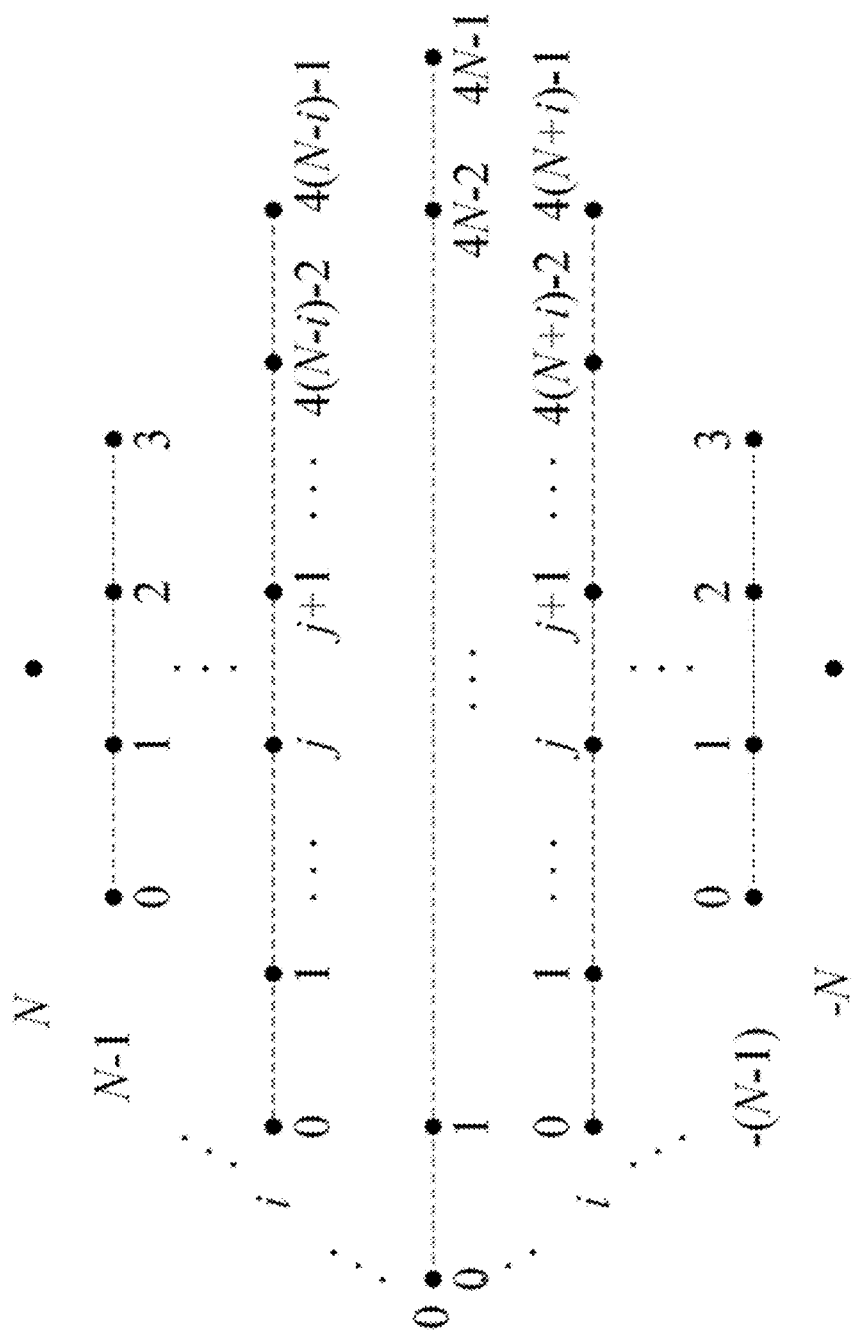
FIG. 4 is a planar expansion map of a spherical mesh expanded by latitude.

To ensure equal probability of each direction and attitude of the magnetic target in the full area, it is necessary to ensure that $\vec{m}_0$ and $\vec{r}_0$ are distributed on the sphere uniformly. Sahr et al. proposed a diamond-shaped meshing method based on regular octahedron, which has the characteristics of uniform meshing and simple structure, but the number of grid points increases exponentially. Based on this method, it provides a meshing method with a more flexible number of grid points. Grid points obtained by the meshing method are expanded into a plane according to latitude, as shown in FIG. 4. In the plane expansion map of the spherical grid, N is the number of meshing layer, and i and j are the number of meshing row and meshing column, respectively. The total number of grid points is $4N^2+2$. The latitude La(i, j) and the longitude Lo(i, j) of the grid point whose meshing row is i and meshing column is j are given by formula (8).

$$\begin{cases} La(i,j) = i/N \cdot 90° \\ Lo(i,j) = \begin{cases} 180° & |i|=N(i=-N, L\ 0, L\ N, \\ & j=0,1, L\ 4(N-i)-1, N\geq 1) \\ j/(N- & |i|\neq N \\ |i|)\cdot 90° \end{cases} \end{cases} \quad (8)$$

Figures 1, 5:
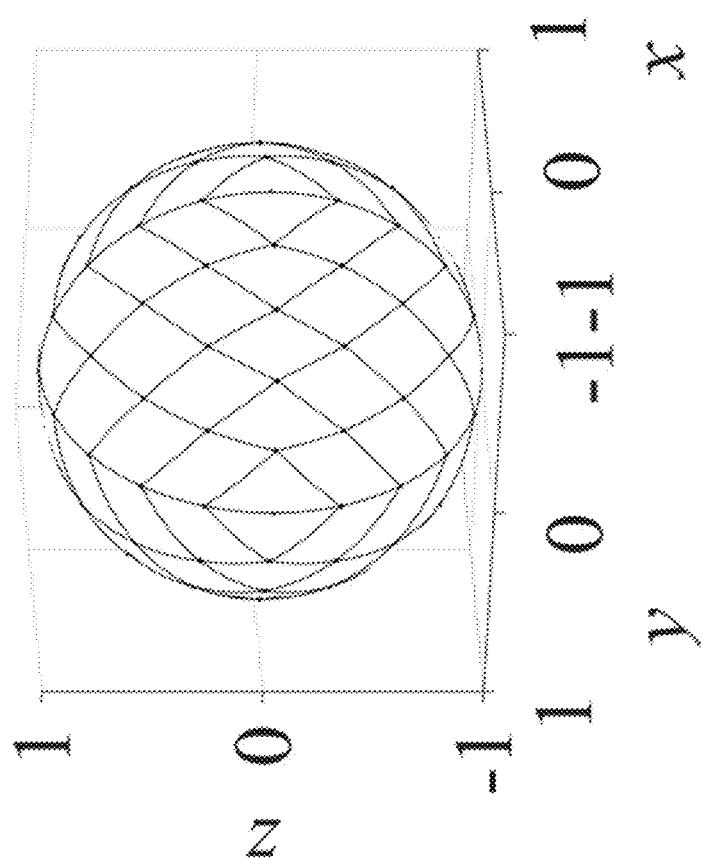
Figures 2, 5:
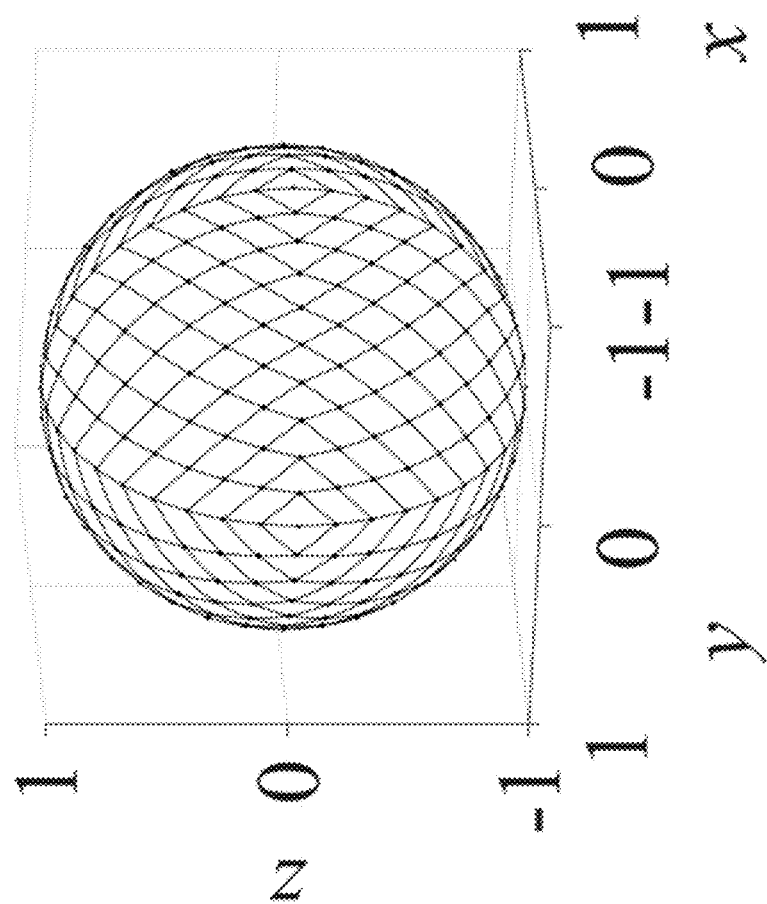

The diagram of the spherical meshing when N=5 and N=10 are shown in FIG. 5-1 and FIG. 5-2. As the value of N is larger, the spherical meshing is more uniform, the probability of occurrence of each direction and each attitude is closer, but the calculation time is also prolonged. In the case that the uniformity of spherical meshing does not affect the analysis, the smallest number of the meshing layer may be selected to reduce unnecessary calculation time.

Because the magnetic moment of the magnetic target is calculated from the position coordinates, the position error δ is used to measure the detection error. The expression is as follows:

$$\delta = \sqrt{(x-x_0)^2+(y-y_0)^2+(z-z_0)_2} \quad (9)$$

where $x_0$, $y_0$, and $z_0$ are real values of position coordinates of the magnetic target, and x, y, and z are calculated values of the position coordinates of the magnetic target. The simulation corresponding to each value combination of $\vec{m}_0$ and $\vec{r}_0$ is called the sub-simulation (SS), and the simulation corresponding to all value combinations of $\vec{m}_0$ and $\vec{r}_0$ is called the global simulation (GS). In the global simulation, the sub-simulation with the detection error less than the detection accuracy is called successful sub-simulation (SSS). In addition to the attitude and the direction of the magnetic target, each value combination of other factors that affect the detection error is called the detection situation. Because the change of the detection situation does not change the relative magnitude of the detection error of the sub-simulation, when calculating the blind zone of the magnetic detection method, it is only necessary to consider a certain detection situation. The calculation formula for the detection success rate DSR in a certain detection situation is:

$$DSR=(\text{Number of SSS/Number of SS})*100\% \quad (10)$$

It can be seen from formula (10) that the detection success rate calculated by the direction-attitude sphere analysis model expresses the probability that the detection error of the magnetic detection method is less than the detection accuracy in a certain detection situation. Therefore, when the change of the meshing layer N does not substantially affect the detection success rate, it can be considered that the spherical meshing does not substantially affect the analysis of the magnetic detection method, to provide a basis for the selection of the meshing layer N.

Figure 6:
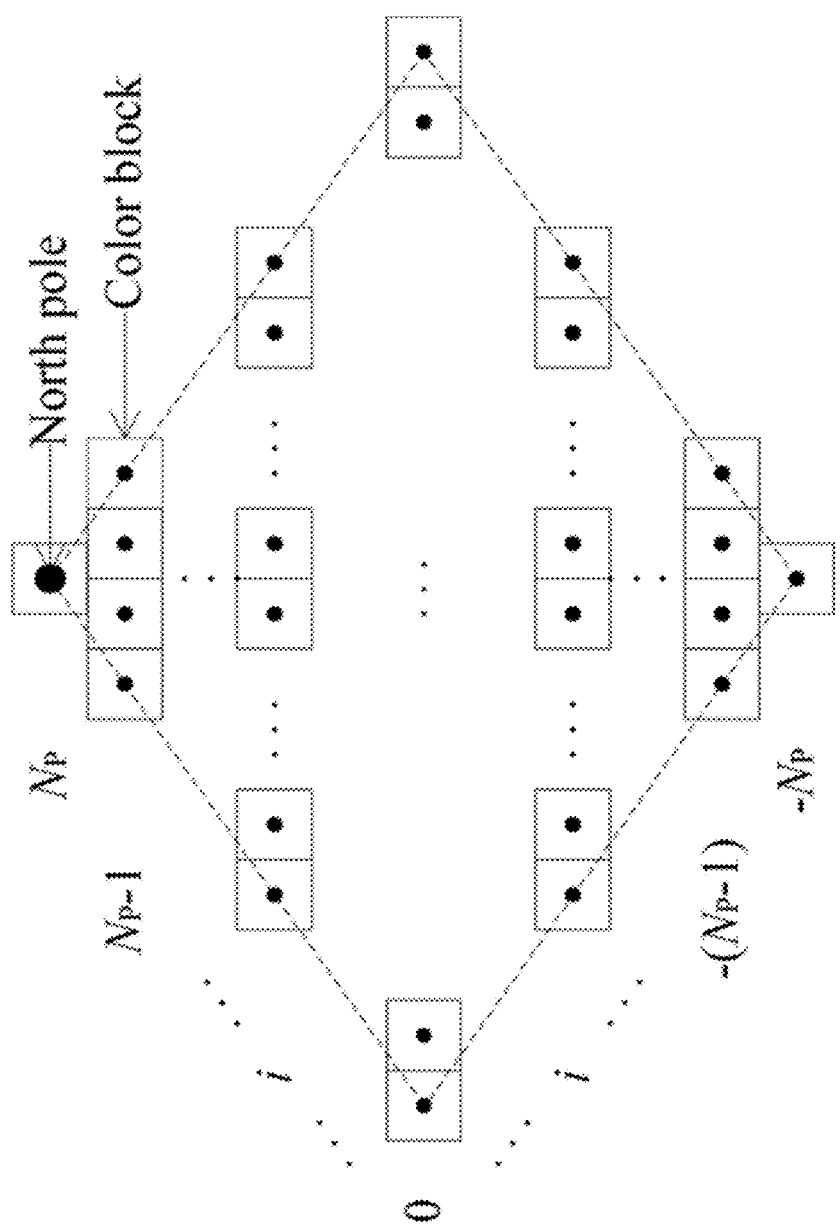
FIG. 6 is a planar expansion map of an attitude-sphere.

To analyze the distribution rule of blind zones more visually, the spherical meshing method is used to expand the simulation data on two spheres into a plane. Expand the attitude-sphere first, then expand the attitude-sphere. The number of the meshing layer of the attitude-sphere is recorded as $N_P$, a square filled with color represents the detection error of a zone around a grid point, the color represents the magnitude of the detection error, and a plane expansion map of the attitude-sphere is shown in FIG. 6. The influence of the attitude of the magnetic target on the detection error may be seen visually from the figure so that the influence of the attitude of the magnetic target on the distribution of the blind zone can be analyzed.

Because the axis z' of the attitude-sphere and $\vec{r}_0$ are consistently on the same straight line, that is, a north pole in the figure consistently coincides with $\vec{r}_0$, the corresponding relationship between the latitude $La_P(i, j)$ and the included angle φ in the figure is shown in formula (11). Therefore, the influence of the included angle φ on the distribution of the blind zone may be analyzed separately from the plane expansion map of the attitude-sphere, which will contribute to analyze a clear distribution rule of the blind zone.

$$La_P(i,j)=90°-\phi \quad (11)$$

Figure 7:
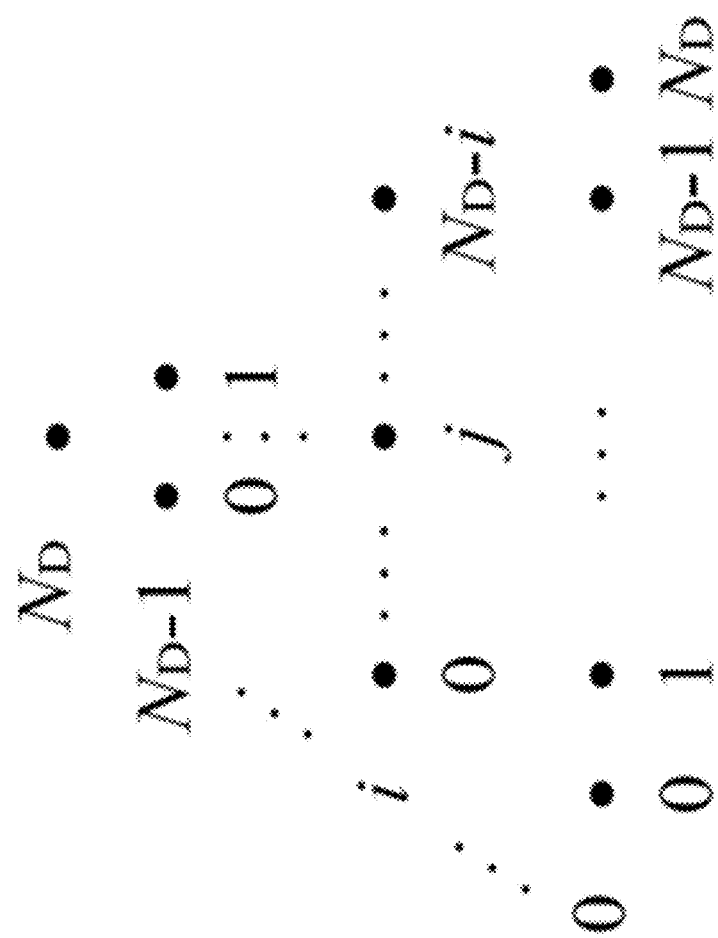
FIG. 7 is a planar expansion map of ⅛ part of a direction-sphere.

The structural forms of the tensor gradiometer are mostly regular hexahedrons and cross-shaped structures, and they both have axisymmetry and central symmetry. It is only necessary to analyze the ⅛ part of the direction-sphere. The magnetic detection situation of other parts of the direction-sphere may be obtained by coordinate rotation. If the structure of the tensor gradiometer is other forms, the part to be analyzed in the direction-sphere is increased according to the situation, and the steps are completely similar. The meshing layer of the direction-sphere model is recorded as $N_D$. A plane expansion map of the ⅛ part of the direction-sphere is shown in FIG. 7.

In the plane expansion map of the ⅛ part of the direction-sphere, the latitude $La_D(i, j)$ and the longitude $Lo_D(i, j)$ of the grid point with the meshing row number of i and the meshing column number of j are given by formula (12).

$$\begin{cases} La_D(i, j) = i/N_D \cdot 90° \\ Lo_D(i, j) = \begin{cases} 180° & |i| = N_D (i = -N_D, L\ 0, L\ N_D, \\ & j = 0, 1, L\ N_D - i, N_D \geq 1) \\ j/(N_D - |i|) \cdot 90° & |i| \neq N_D \end{cases} \end{cases} \quad (12)$$

Figure 8:
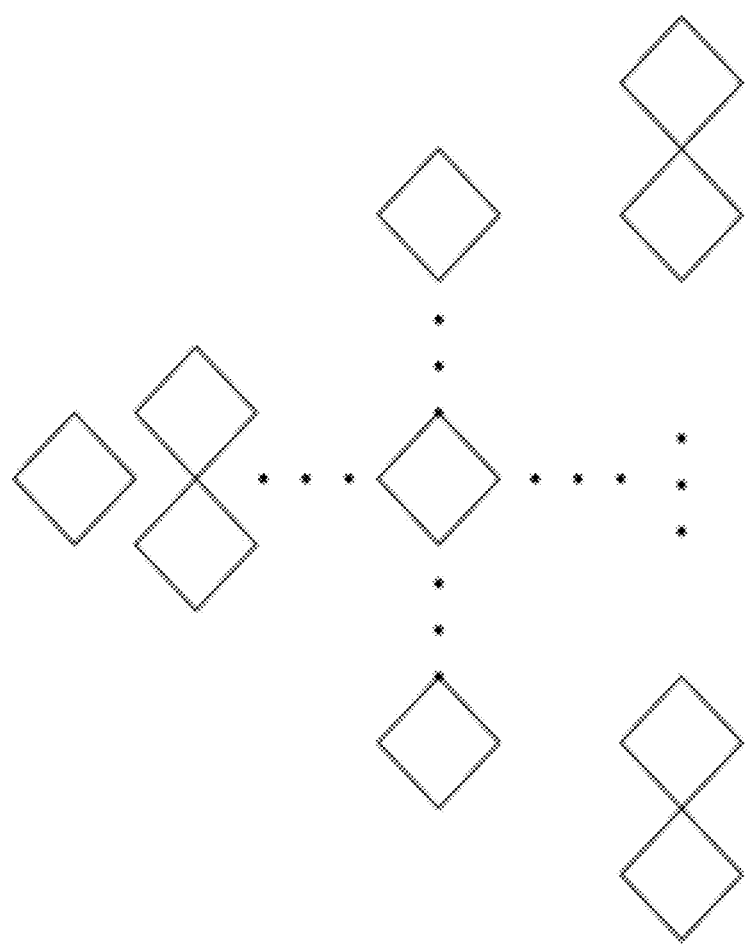
FIG. 8 is a planar expansion map of a direction-attitude sphere model.

It can be seen from FIG. 6 that the outer contour of the attitude-sphere is a rhombus, the plane expansion map of the attitude-sphere is represented by the rhombus. The plane expansion map of the ⅛ part of the direction-attitude sphere and the plane expansion map of the attitude-sphere are combined into the plane expansion map of the direction-attitude-sphere, as shown in FIG. 8. Different grid points on the plane expansion map of the direction-sphere represent different magnetic target directions. Therefore, by comparing different plane expansion maps of the attitude-sphere, the influence of the direction $\vec{r}_0$ of the magnetic target on the detection error may be analyzed separately.

The plane expansion map of the direction-attitude-sphere is also the distribution map of the blind zone of the magnetic detection method. From FIG. 8, the influence of the direction $\vec{r}_0$ and the included angle φ of the magnetic target on the distribution of the blind zone can be analyzed separately to obtain the distribution rule of the blind zone of the magnetic detection method.

Figure 9:
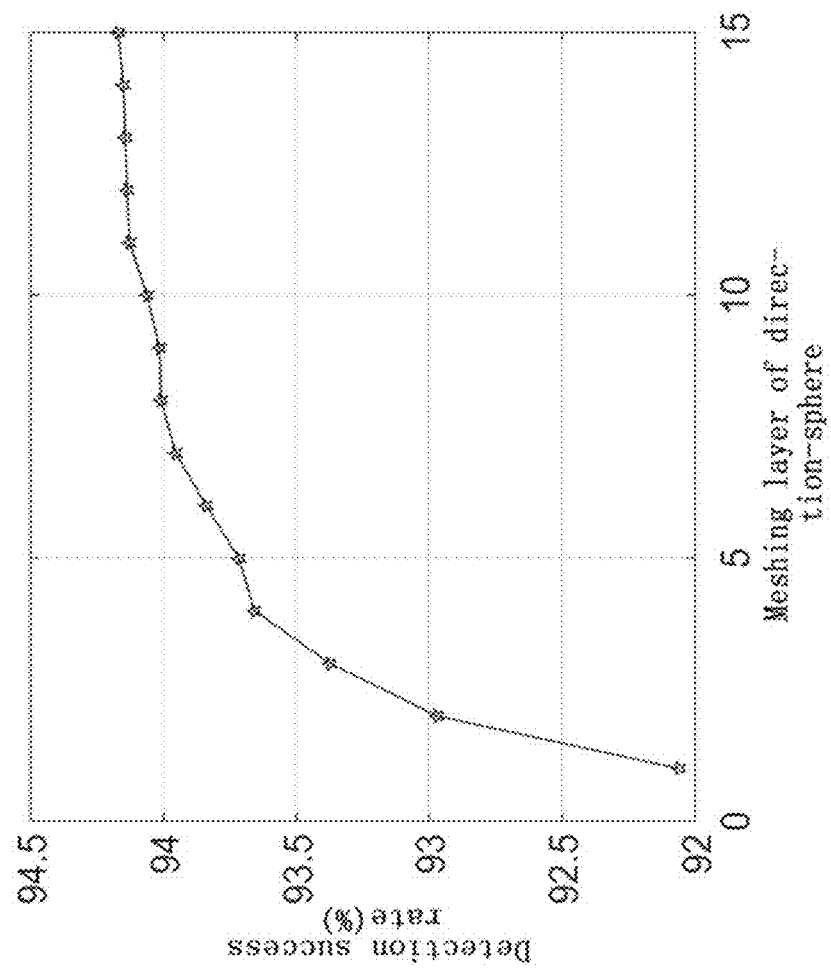
FIG. 9 is a schematic diagram showing the change of the detection success rate with the meshing layer $N_D$.

In one embodiment of the invention, the analysis of the blind zone of the detection method is performed using the NARA method as an example. In the direction-attitude-sphere analysis model, it is firstly ensured that the meshing of the attitude-sphere is sufficiently uniform, and the meshing layer of the attitude-sphere $N_P=50$. In the magnetic detection model, the magnitude of the magnetic moment M=27 A·m², the distance between the magnetic target and the magnetic gradiometer r=3 m, the sensitivity of magnetic sensor S=0.1 nT, the baseline distance of the magnetic gradiometer D=0.1 m, the DC magnetic field noise is 0.6 nT, the standard deviation of an AC magnetic field noise is 0.001 nT, and the detection accuracy is 0.3 m. The change of the detection success rate with the meshing layer $N_D$ is shown in FIG. 9. With the increase of $N_D$, the detection success rate tends to be stable. In consideration of calculation costs, $N_D=7$ is an appropriate selection.

Figure 10:
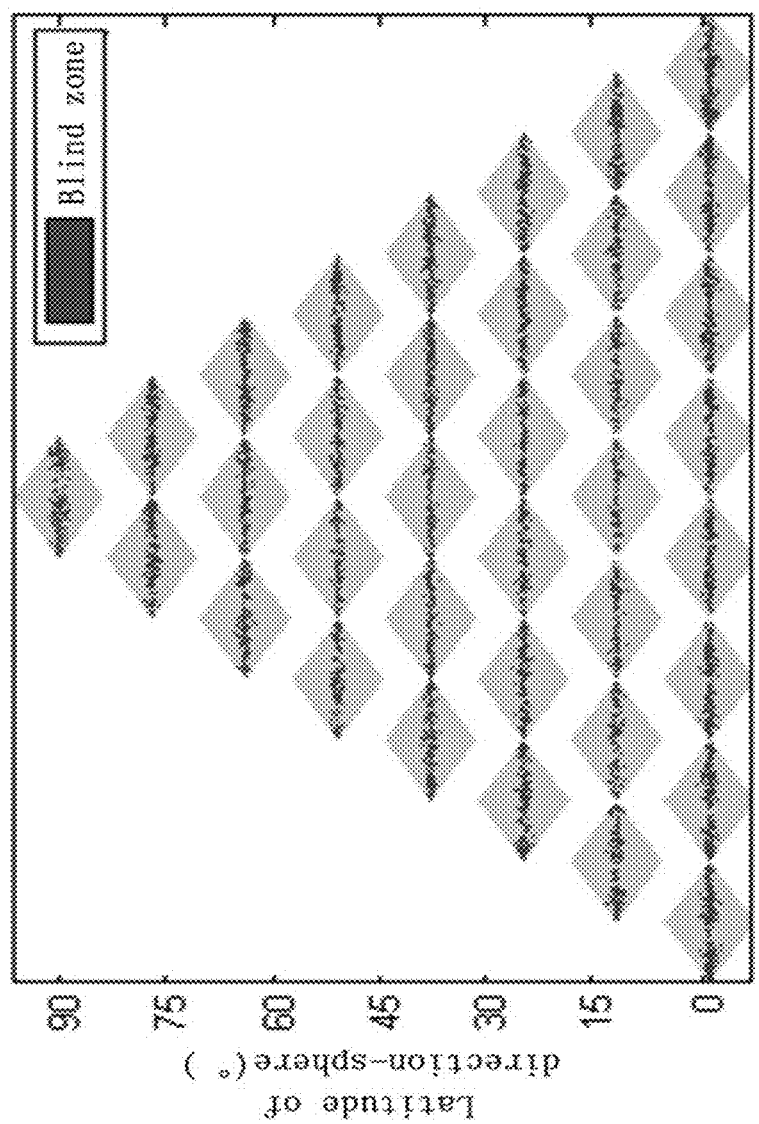
FIG. 10 is a distribution map of the blind zone of the NARA method.

As an example, the blind zone rate bz is set to be 15%. In order to display the distribution of the blind zone of the NARA method better, if the detection error belongs to the first 15% of the largest detection error, it is assigned with a value of 1. If the detection error does not belong to the first 15% of the largest detection error, it is assigned with a value of 0. The distribution map of the blind zone of the NARA method is shown in FIG. 10. Each of the plane expansion maps of the attitude-sphere is almost the same. Blind zones are mainly concentrated near the equator of the attitude-sphere, that is, the included angle of φ between $\vec{m}_0$ and $\vec{r}_0$ is close to 90°.

Therefore, the distribution rule of the blind zone of the NARA method is mainly related to the included angle φ. When the included angle φ is close to 90°, the blind zone is formed. The analysis steps of the distribution rules of the blind zone of other detection methods are completely similar.

According to the laboratory conditions, a blind zone experiment of the NARA method is designed to verify the distribution of the blind zone in a dashed box in FIG. 10. An experimental system is composed of a magnet (N38), a magnetic gradiometer consisting of a fluxgate (Mag03), a non-magnetic turntable and a computer. The size of the magnet is 60 mm×60 mm×15 mm (length×width×height), and the magnitude of the magnetic moment is 47.6 A·m². The sensitivity of the fluxgate is 0.1 nT. The non-magnetic turntable changes the attitude of the magnet by rotating.

With the center of the magnetic gradiometer as an origin, space rectangular coordinate system is established. The non-magnetic turntable is rotated by 15° counterclockwise each time to change the attitude of the magnet, so that the included angle $\phi=0°, 15°, \ldots, 90°$. The baseline distance of the magnetic gradiometer $D=0.12, 0.18, \ldots, 0.42$ m.

Figure 11:
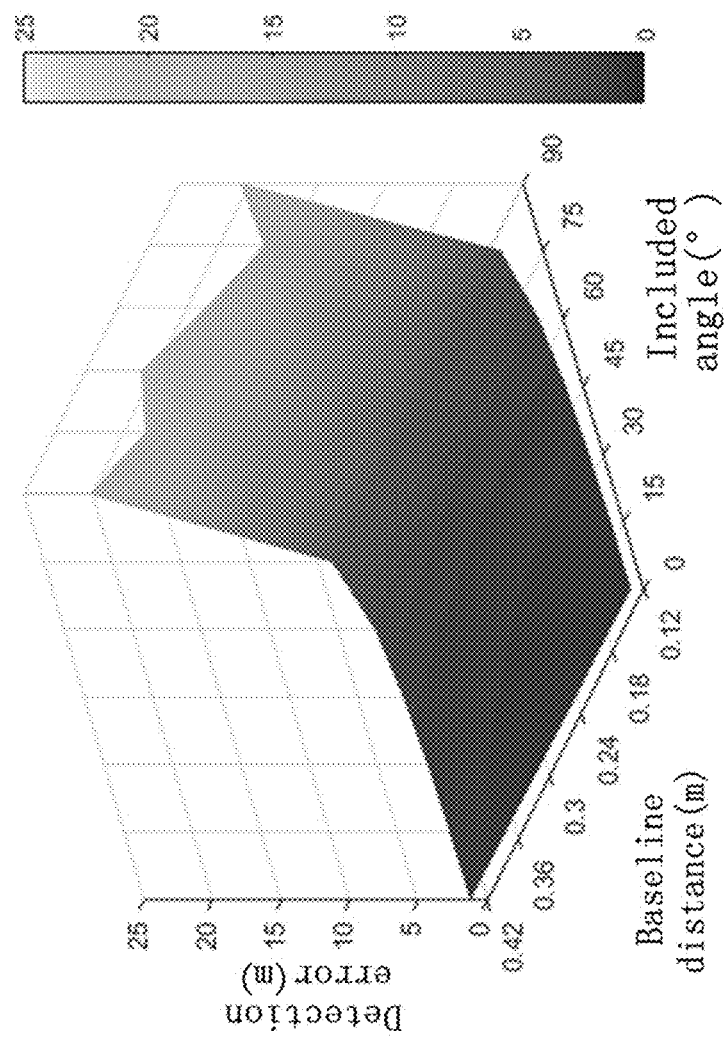
FIG. 11 is a diagram of the detection error in the blind zone experiment.

The detection error in the blind zone experiment of the NARA method is shown in FIG. 12, and it is drawn into a three-dimensional curved surface chart, as shown in FIG. 11. Because the blind zone rate bz=15%, in the range of 0° ~90°, the width of the blind zone is about 15°. It can be seen that the range of 75° ~90° is the blind zone of the NARA method. Therefore, the experiment has verified that when the included angle $\phi$ is close to 90°, the blind zone of the NARA method appears. Meanwhile, the experiment has also verified that when the detection situation changes, the relative magnitude of the detection error in the entire zone does not change. Therefore, when the distribution rule of the blind zone of the magnetic detection method is analyzed, only a certain detection situation should be considered.

While the present invention has been described in some detail for purposes of clarity and understanding, one skilled in the art will appreciate that various changes in form and detail can be made without departing from the true scope of the invention. The specific embodiments are used herein to illustrate the concept of the invention and shall not, in any way, be construed to limit the scope of the invention which is defined by the claims. All figures, tables, appendices, patents, patent applications and publications, referred to above, are hereby incorporated by reference.

What is claimed is:

1. A method for analyzing a magnetic detection blind zone, comprising the following steps:
   a, establishing a complete magnetic detection model to calculate position and magnetic moment of a magnetic target as detected by a magnetic gradiometer comprising multiple magnetic sensors, which comprises the steps of: 1) establishing a magnetic target model based on magnetic dipole model to obtain a magnetic field $\vec{B}_o$ generated only by the magnetic target; 2) superposing a noise signal generated by the noise model $No(\mu, \sigma^2)$ onto the magnetic field $\vec{B}_O$ to obtain a superposed magnetic field $\vec{B}_r$; 3) establishing a magnetic sensor model based on the sensitivity of the magnetic sensors and using the magnetic sensor model to perform data processing on the magnetic field $\vec{B}_r$ to obtain output values of the magnetic sensors, $\vec{B}_S$; 4) establishing a tensor model based on the structure of the magnetic gradiometer that is used for the magnetic detection and using the $\vec{B}_S$ as inputs for the tensor model data processing to obtain an output value of the magnetic gradiometer, $\vec{G}$; 5) establishing an inversion model based on the magnetic detection method and using the $\vec{G}$ as an input for the inversion model data processing to obtain calculated position and magnetic moment of the magnetic target;
   b, establishing a direction-attitude-sphere model of the magnetic target to represent the entire zone of all possible positions and attitudes of the magnetic target, wherein the attitude of the magnetic target is represented by its unit magnetic moment vector $\vec{m}_0$, the direction of the magnetic target is represented by its unit position vector $\vec{r}_0$, and an included angle between $\vec{m}_0$ and $\vec{r}_0$ is $\phi$, wherein a direction-sphere is formed by making $\vec{r}_0$ cover the entire direction-sphere, wherein for each $\vec{r}_0$, there is an attitude-sphere formed by making $\vec{m}_0$ cover the entire attitude-sphere, and wherein the coordinate system of the direction-sphere coincides with the coordinate system of the magnetic gradiometer, and the axis z' of the coordinate system of the attitude-sphere and $\vec{r}_0$ are aligned on the same straight line;
   c, dividing the surface of the direction-attitude-sphere into meshes of an equal size so that each detection condition is represented with equal probability, and expanding the meshes into a plane layered according to their latitude, wherein N is the number of meshing layers, i and j are the number of meshing row and meshing column, respectively, and wherein the latitude (La(i,j)) and the longitude (Lo(i,j)) of a mesh with the mesh row number of i and the mesh column number of j are given by the following formula:

$$\begin{cases} La(i, j) = i/N \cdot 90° \\ Lo(i, j) = \begin{cases} 180° & |i| = N(i = -N, L\ 0, L\ N, \\ & j = 0, 1, L\ 4(N-i)-1, N \geq 1) \\ j/(N-|i|) \cdot 90° & |i| \neq N \end{cases} \end{cases}$$

d, calculating detection success rates based on the magnetic detection model, the direction-attitude-sphere model and the meshing method for different meshing layers N and selecting the smallest meshing layer N when the detection success rates tend to be stable; and
   e, building a distribution map of the magnetic detection blind zone based on the magnetic detection model, the direction-attitude-sphere model and a selected meshing layer N, and analyzing the distribution map of the magnetic detection blind zone to obtain a distribution rule of the magnetic detection blind zone.

2. The method for analyzing a magnetic detection blind zone of claim 1, further comprising performing magnetic detection using the magnetic gradiometer while avoiding the magnetic detection blind zone by adjusting the position of the magnetic gradiometer so as to increase the detection accuracy.

* * * * *